United States Patent
Lee et al.

(10) Patent No.: US 7,786,010 B2
(45) Date of Patent: Aug. 31, 2010

(54) METHOD FOR FORMING A THIN LAYER ON SEMICONDUCTOR SUBSTRATES

(75) Inventors: Hyun-Wook Lee, Seoul (KR); Wan-Goo Hwang, Gyeonggi-do (KR); Bu-Cheul Lee, Gyeonggi-do (KR); Jeong-Soo Suh, Seoul (KR); Sung-Il Han, Gyeonggi-do (KR); Seong-Ju Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 427 days.

(21) Appl. No.: 11/856,908

(22) Filed: Sep. 18, 2007

(65) Prior Publication Data
US 2008/0132069 A1    Jun. 5, 2008

(30) Foreign Application Priority Data
Sep. 29, 2006   (KR) ...................... 10-2006-0095543

(51) Int. Cl.
H01L 21/44    (2006.01)
(52) U.S. Cl. ............... 438/680; 438/681; 257/E21.168; 427/124
(58) Field of Classification Search ................ 438/680, 438/681; 257/E21.161, E21.168, E21.478; 427/124, 255.28
See application file for complete search history.

(56) References Cited

U.S. PATENT DOCUMENTS

| | | | | |
|---|---|---|---|---|
| 6,869,876 B2 * | 3/2005 | Norman et al. | ............. | 438/680 |
| 6,911,092 B2 * | 6/2005 | Sneh | ............. | 118/715 |
| 7,335,569 B2 * | 2/2008 | Senzaki | ............. | 438/393 |
| 2005/0056219 A1 * | 3/2005 | Dip et al. | ............. | 118/722 |
| 2008/0050916 A1 * | 2/2008 | Yonker et al. | ............. | 438/685 |

FOREIGN PATENT DOCUMENTS

| | | |
|---|---|---|
| JP | 2003-297818 | 10/2003 |
| KR | 100253271 B1 | 1/2000 |
| KR | 1020010081622 A | 8/2001 |

* cited by examiner

Primary Examiner—Tuan N. Quach
(74) Attorney, Agent, or Firm—Volentine & Whitt, P.L.L.C.

(57) ABSTRACT

An apparatus and a method form a thin layer on each of multiple semiconductor substrates. A processing chamber of the apparatus includes a boat in which the semiconductor substrates are arranged in a vertical direction. A vaporizer vaporizes a liquid metal precursor into a metal precursor gas. A buffer receives a source gas from the vaporizer and increases a pressure of the source gas to higher than atmospheric pressure, the source gas including the metal precursor gas. A first supply pipe connects the buffer and the processing chamber, the first supply pipe including a first valve for controlling a mass flow rate of the source gas. A second supply pipe connects the vaporizer and a pump for creating a vacuum inside the processing chamber, the second supply pipe including a second valve for exhausting a dummy gas during an idling operation of the vaporizer.

16 Claims, 7 Drawing Sheets

|  |  | 41.5223 |  |  |
|  | 38.878 | 23.4731 | 38.7834 |  |
| 48.9247 | 33.1858 | 20.7577 | 31.2442 | 57.7462 |
|  | 44.9098 | 31.965 | 44.2597 |  |
|  |  | 47.7918 |  |  |

|  |  | 40.499 |  |  |
|  | 40.1276 | 33.5463 | 46.0198 |  |
| 41.5099 | 36.1863 | 22.3298 | 32.4878 | 61.118 |
|  | 51.0642 | 32.3115 | 46.5115 |  |
|  |  | 56.0671 |  |  |

FIG. 7

|   |   |   |   |   |   |   |   |   |   |   |   |
|---|---|---|---|---|---|---|---|---|---|---|---|
|   |   |   |   |   |   |   |   |   |   |   |   |
| 39.22 | 39.31 | 39.21 |   |   |   |   |   |   |   |   |   |
|   |   |   | 39.07 | 39.00 |   |   |   |   |   |   |   |
|   | 39.13 |   |   |   | 40.58 |   | 38.87 |   |   |   |   |
| 39.14 |   |   |   | 40.50 |   | 40.46 |   |   |   |   |   |
|   |   |   | 40.41 |   |   |   | 40.37 |   | 38.75 |   |   |
|   |   | 39.16 |   | 40.28 | 40.48 | 40.65 | 40.61 | 40.40 |   | 38.76 |   |
|   |   | 39.36 |   | 40.29 | 40.42 | 40.38 | 40.61 |   | 40.33 | 38.77 |   |
|   |   | 39.15 |   |   | 40.30 | 40.40 | 40.42 | 40.52 | 40.26 |   | 38.91 |
|   |   |   | 39.17 |   |   | 40.25 |   | 40.27 |   |   |   |
|   |   |   |   |   |   |   | 40.26 |   | 40.27 | 38.70 |   |
|   |   |   |   |   | 38.95 |   |   | 40.24 |   | 38.73 |   |
|   |   |   |   |   |   | 38.92 |   |   |   |   | 38.70 |
|   |   |   |   |   |   |   |   | 38.99 | 39.02 | 38.81 |   |
|   |   |   |   |   |   |   |   |   |   |   |   |

METHOD FOR FORMING A THIN LAYER ON SEMICONDUCTOR SUBSTRATES

CROSS-REFERENCES TO RELATED APPLICATIONS

A claim of priority is made to Korean Patent Application No. 10-2006-0095543, filed on Sep. 29, 2006, the subject matter of which is hereby incorporated by reference.

BACKGROUND OF THE INVENTION

1. Field of the Invention

Exemplary embodiments of the present invention relate to an apparatus and method for forming a thin layer on a substrate. More particularly, exemplary embodiments of the present invention relate to an apparatus and method for forming a thin layer on a semiconductor substrate by increasing pressure of a source gas.

2. Description of the Related Art

A thin layer is formed on a semiconductor substrate, such as a wafer, and processed into a pattern including electrical characteristics to fabricate a semiconductor device. The thin layer is formed on the substrate by a deposition process, such as a chemical vapor deposition (CVD) process, a physical vapor deposition (PVD) process and an atomic layer deposition (ALD) process. As recent semiconductor devices have high degrees of integration and small unit cells with reduced pattern line widths, the ALD process has become widely used as the deposition process for forming the thin layer.

A deposition apparatus for the ALD process (hereinafter referred to as an ALD apparatus) is classified as either a horizontal type or a vertical type in accordance with a shape and orientation of a processing chamber. The vertical type ALD apparatus has been the most widely used because the footprint of the vertical type ALD apparatus is much smaller than that of the horizontal type ALD apparatus. The vertical type ALD apparatus includes a vertical processing chamber that includes an inner space defined by vertical walls. A wafer is placed into the inner space of the vertical processing chamber, which provides a vacuum environment. A number of wafers are placed into the inner space of the vertical processing chamber at one time for improving the deposition efficiency of the vertical ALD apparatus using a batch process.

In general, source materials for a thin layer must be supplied in a gaseous state into a processing chamber. Thus, the vertical type ALD apparatus has a liquid delivery system which includes a vaporizer for vaporizing liquid source materials and an injector for uniformly supplying the vaporized source materials into the processing chamber. More particularly, in the case of a batch-type ALD apparatus, vertically uniform injection of the vaporized source materials is essential for the uniformity of the thin layers because multiple wafers are vertically stacked in the processing chamber.

The higher the degree of integration of a semiconductor device, the smaller the thickness of the thin layer. The thin layer in a highly integrated semiconductor device therefore includes dielectric materials having a high dielectric constant. However, the material having the high dielectric constant usually has a high molecular weight, and is not sufficiently vaporized in the vaporizer due to the high molecular weight. Therefore, the material having the high dielectric constant is supplied to the injector at a relatively low pressure. As a result, a relatively large amount of the source material is supplied into the processing chamber through the injector near the vaporizer, and a relatively small amount of the source material is supplied into the processing chamber through the injector far from the vaporizer.

Further, the vaporizer generally requires a constant temperature for efficient maintenance. An idling process is therefore performed in the vaporizer even when the processing chamber stops performing the ALD process. During the idling process, for example, an inert gas, such as nitrogen gas, is injected into the processing chamber and exhausted from the processing chamber through an exhaust pump. Accordingly, the idling process is necessarily performed in a preliminary operation period during which the source materials are vaporized for the ALD process, and thus the reaction gas for the ALD process does not have sufficient pressure when supplied from the injector. Therefore, much more of a reaction gas is supplied into the processing chamber through the injector nearest the vaporizer, and much less of a reaction gas is supplied into the processing chamber through the injector furthest from the vaporizer.

Due to the above-described structural features of the conventional ALD apparatus, the reaction gas does not have sufficient pressure when injected into the processing chamber through the injector, and is non-uniformly supplied into the processing chamber. The non-uniform supply of the reaction gas leads to non-uniformity in the thickness of the thin layer on a wafer and causes various processing defects in subsequent processes on the wafer.

FIG. 1 is a scanning electron microscope (SEM) picture showing a hafnium oxide ($HfO_2$) layer formed by an ALD process in a conventional batch-type ALD apparatus. FIG. 2 is a view illustrating a thickness distribution of a thin layer formed by a conventional batch-type ALD apparatus. The hafnium oxide layer in FIG. 1 was formed on a wafer of about 200 mm, and the thin layer in FIG. 2 was formed on a wafer of about 300 mm. Both of the wafers in FIGS. 1 and 2 were positioned at a top portion of a wafer boat extended vertically in a vertical processing chamber.

Referring to FIG. 1, a peripheral portion 12 of the hafnium oxide layer is thicker than a central portion 14, creating an appearance similar to a volcano crater. The hafnium oxide layer was formed into an average thickness of about 31.49 Å with a deviation of about 2.12 Å. Experimental results show that an average deviation of all the wafers in the vertical wafer boat was about 3.09 Å. Similarly, FIG. 2 shows that the thin layer has a thickness of about 20.76 Å at a central portion of the wafer and gradually increases toward a peripheral portion.

The thickness reduction of the thin layer at the central portion of the wafer causes a current leakage from the central portion. The current leakage deteriorates the performance of semiconductor devices.

Proposals have been suggested for improving the flow uniformity of the reaction gas when the reaction gas is supplied into the processing chamber in the conventional batch-type ALD apparatus. For example, the injector has been modified to include several injection holes having sizes gradually vary in accordance with a vertical direction of the processing chamber, or the vaporized source gas was more highly pressurized. Further, it has been suggested that a buffer be installed around the injector and thus allow the reaction gas to flow into the processing chamber at a steady-state steady-flow (SSSF). However, these proposals have not sufficiently improved the flow uniformity of the reaction gas. Moreover, the proposals generally require significant additional costs, thereby reducing the manufacturing efficiency of semiconductor devices.

SUMMARY OF THE INVENTION

According to an aspect of the present invention, there is provided a method of forming a thin layer on each of multiple semiconductor substrates. The method includes forming a first source gas, including a metal precursor gas, having a pressure higher than atmospheric pressure. Forming the first source gas includes discharging the metal precursor gas into a buffer having a constant volume. The method also includes forming a metal precursor layer on each substrate by providing the first source gas onto the semiconductor substrates in a processing chamber. The inside of the processing chamber is purged using a first purge gas. The metal precursor layer is changed into a metal layer by providing a second source gas onto the metal precursor layer. The inside of the processing chamber is purged using a second purge gas.

Forming the first source gas may further include disconnecting the buffer and the processing chamber, vaporizing a liquid metal precursor in a vaporizer to form the metal precursor gas, and stopping an exhaustion of a dummy gas for performing an idling operation of the vaporizer. Disconnecting the buffer and the processing chamber may include controlling a first valve in a first supply pipe between the buffer and the processing chamber.

The method may also include controlling the pressure of the first source gas by controlling a mass flow rate of the liquid metal precursor that flows into the vaporizer. The pressure of the first source gas is controlled to be about 0.5 MPa to about 1.0 MPa. Stopping the exhaustion of the dummy gas may include controlling a second valve in a second supply pipe between the vaporizer and a pump unit for creating a vacuum on the inside of the processing chamber. The dummy gas may be nitrogen (N2) gas. The second valve may be closed while discharging the metal precursor gas into the buffer to increase the pressure of the source gas.

The liquid metal precursor may include at least one of hafnium butoxide (Hf(OC4H9)4), tetrakis(ethylmethylamino)hafnium (TEMAH) (Hf(NCH3C2H5)4), and tetrakis(ethylmethylamino)zirconium (TEMAZ) (Zr(NCH3C2H5)4).

The semiconductor substrates may be arranged vertically in the processing chamber and spaced apart from one another by a predetermined distance, and each substrate is positioned substantially horizontally with respect to the processing chamber. The first source gas and the second source gas may be provided through first nozzles and second nozzles, respectively, positioned in a vertical direction of the processing chamber adjacent to the semiconductor substrates. The first purge gas and the second purge gas may be provided through the first nozzles, the second nozzles and at least one third nozzle interposed between the first and second nozzles. The processing chamber may have a temperature of about 350° C. to about 550° C.

The second source gas may be an ozone (O3) gas. The first source gas may be provided by a first carrier gas and the second source gas is provided by a second carrier gas. Also, each of the first purge gas and the second purge gases may be nitrogen (N2) gas or an inert gas. A mass flow rate of the first purge gas may be substantially identical to a mass flow rate of the second purge gas, and a mass flow rate of the first carrier gas may be substantially identical to a mass flow rate of the second purge gas.

According to another aspect of the present invention, there is provided an apparatus for forming a thin layer on each of multiple semiconductor substrates. The apparatus includes a processing chamber having a boat in which the substrates are arranged in a vertical direction; a vaporizer for vaporizing a liquid metal precursor into a metal precursor gas; and a buffer for receiving a source gas from the vaporizer and increasing a pressure of the source gas to higher than atmospheric pressure, where the source gas includes the metal precursor gas. A first supply pipe connects the buffer and the processing chamber, and includes a first valve for controlling a mass flow rate of the source gas. A second supply pipe connects the vaporizer and a pump for creating a vacuum inside the processing chamber, and includes a second valve for exhausting a dummy gas during an idling operation of the vaporizer.

The processing chamber may extend in the vertical direction and have a substantially cylindrical shape with an open bottom portion. The apparatus may further include a furnace enclosing the processing chamber and heating the processing chamber to a processing temperature. A manifold may be connected to the open bottom portion of the processing chamber, the manifold having a cylindrical shape with an open top portion and an open bottom portion. A vertical driver may move the boat into or out of the processing chamber through the manifold.

The apparatus may further a third pipe connecting the vaporizer and the buffer, where the second supply pipe diverges from the third pipe. Also, the apparatus may include a controller for controlling the second valve to close in order to discharge the metal precursor gas into the buffer when the liquid metal precursor is supplied into the vaporizer. The controller may also control the first valve to open in order to supply the source gas into the processing chamber.

Vaporized source gases may discharged into the buffer and the pressure of the source gases is increased in the buffer, so that the source gases may be injected into the processing chamber at a high pressure, thereby improving the injection uniformity of the source gases and the thickness uniformity of the thin layers in the processing chamber.

BRIEF DESCRIPTION OF THE DRAWINGS

The embodiments of the present invention will be described with reference to the attached drawings, in which:

FIG. 7 is a view illustrating a thickness distribution of a thin layer formed in an apparatus, according to an exemplary embodiment of the present invention.

DESCRIPTION OF THE EMBODIMENTS

Figures 1, 2:
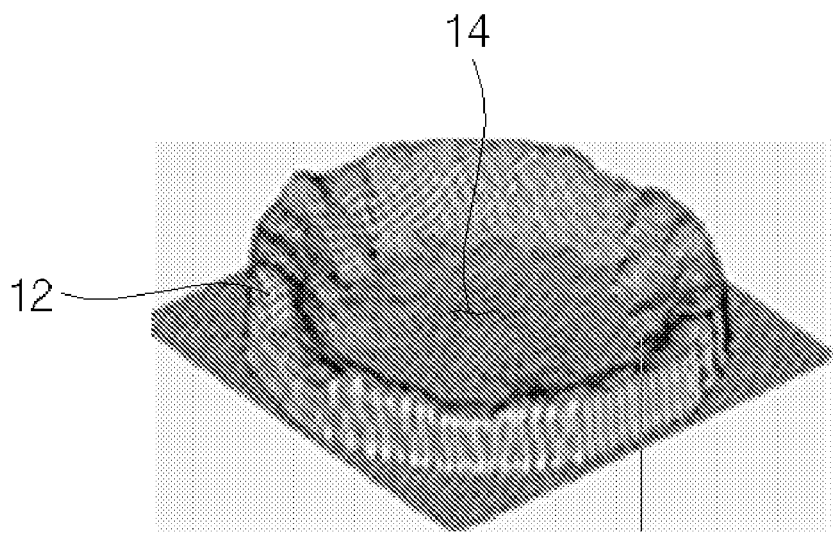
FIG. 1 is a scanning electron microscope (SEM) picture showing a hafnium oxide (HfO$_2$) layer formed by an atomic layer deposition (ALD) process in a conventional batch-type ALD apparatus.
FIG. 2 is a view illustrating a thickness distribution of a thin layer formed in a conventional batch-type ALD apparatus.

The present invention will now be described more fully with reference to the accompanying drawings, in which exemplary embodiments of the invention are shown. The invention, may, however, be embodied in various different forms, and should not be construed as being limited to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Also, in the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc., may be used to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures were turned over, elements described as "below" or "beneath" other elements or features would then be oriented "above" the other elements or features. Thus, the exemplary term "below" can encompass both an orientation of above and below. Likewise, the device may be otherwise oriented (rotated 90 degrees or at other orientations) and the spatially relative descriptors should be interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of various embodiments of the invention. Therefore, variations from the specific shapes of these illustrations, resulting, for example, from manufacturing techniques and/or tolerances, are to be expected. Thus, embodiments of the invention should not be construed as limited to the particular shapes of regions illustrated herein, but are to include deviations in shapes. For example, as a practical matter, an implanted region illustrated as a rectangle will typically have rounded or curved features and/or a gradient of implant concentration at its edges rather than a binary change from implanted to non-implanted region. Likewise, a buried region formed by implantation may result in some implantation in the region(s) between the buried region and the surface through which the implantation takes place. Thus, the regions illustrated in the figures are schematic in nature and their shapes are not intended to illustrate the actual shape of a region of a device and are not intended to limit the spirit or scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meanings in the context of the relevant art, and will not be interpreted in an idealized or overly formal sense unless expressly so defined herein.

Apparatus for Forming a Thin Layer

Embodiments of the present invention provide an apparatus for forming a thin layer having a uniform thickness across a wafer by a deposition process, in which flow uniformity of a reaction gas is improved, for example, by increasing the pressure of vaporized source materials.

Figure 3:
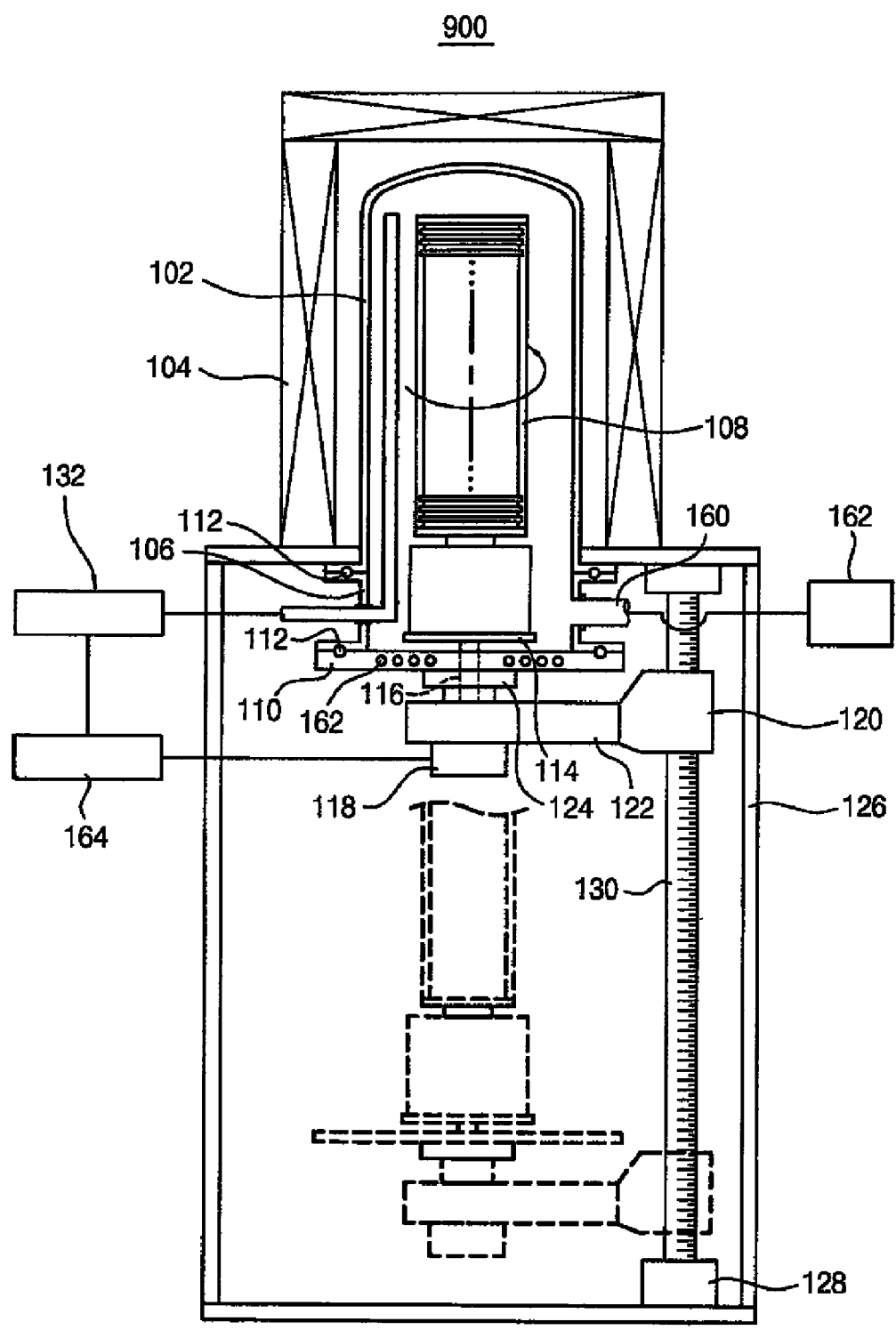
FIG. 3 is a cross-sectional view illustrating an apparatus for forming a thin layer, according to an exemplary embodiment of the present invention.
Figure 4:
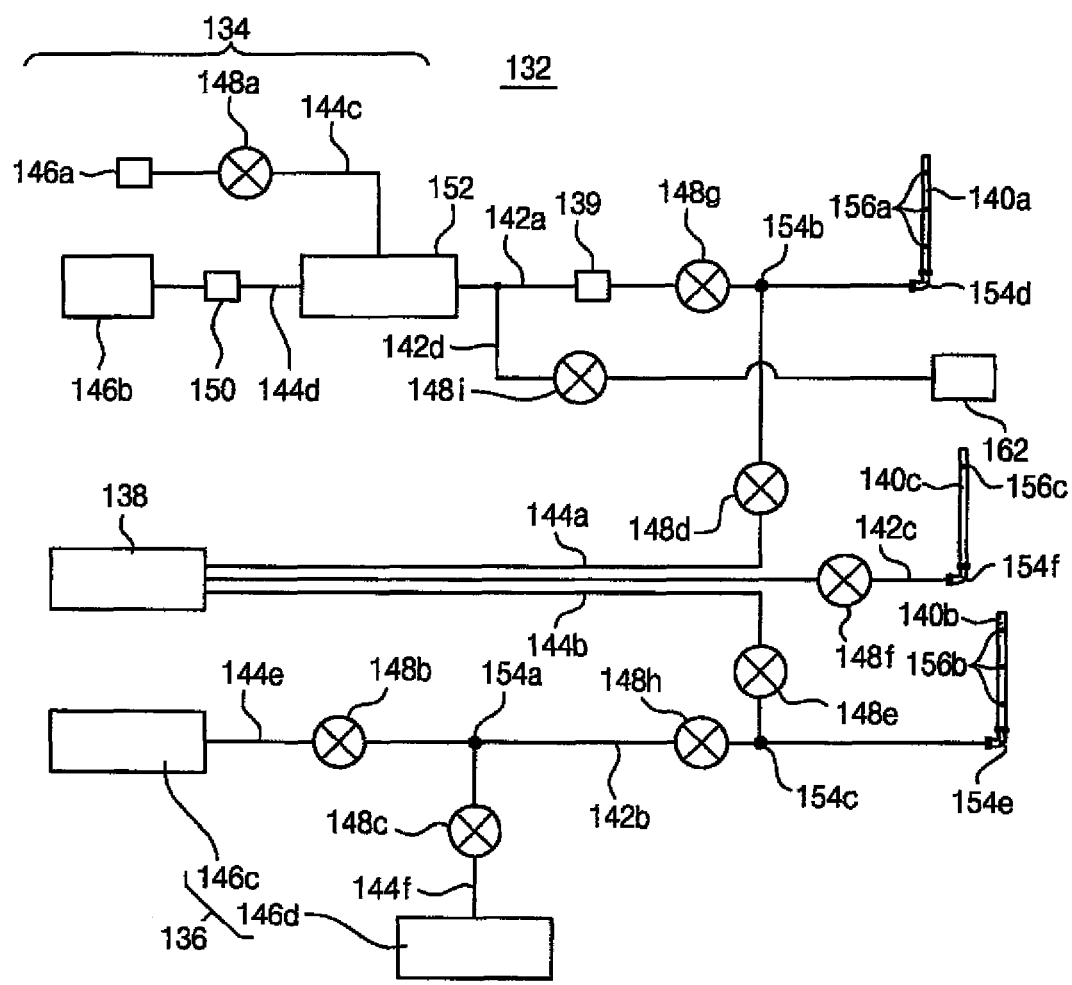
FIG. 4 is a block diagram illustrating the structure of the gas provider shown in FIG. 3, according to an exemplary embodiment of the present invention.

FIG. 3 is a cross-sectional view illustrating an apparatus for forming a thin layer in accordance with an exemplary embodiment of the present invention, and FIG. 4 is a view illustrating the structure of the gas provider shown in FIG. 3.

In an exemplary apparatus for forming a thin layer shown in FIG. 3, various thin layers may be formed on a semiconductor substrate, such as a silicon wafer. Referring to FIG. 3, an apparatus 900 for forming a thin layer includes a processing chamber 102, which may include a batch-type vertical reaction furnace. In an exemplary embodiment, the processing chamber 102 including quartz extends in a vertical direction, and has a cylindrical shape of which a bottom portion is at least partially open. A furnace 104 for heating the processing chamber 102 encloses the processing chamber 102. A cylindrical manifold 106, including a metal, is connected to the bottom portion of the processing chamber 102.

A boat 108, in which wafers are vertically stacked and separated from each other by a distance, is loaded into the processing chamber 102 through the manifold 106. A lid member 110 closes the manifold 106 after the boat 108 is loaded into the processing chamber 102. A seal member 112 is interposed between the processing chamber 102 and the manifold 106 and between the manifold 106 and the lid member 110.

The boat 108 is positioned on a turntable 114 that is coupled to an end of a rotational axis 116. A vertical driving unit 120 for vertically moving the boat is positioned in a load-lock chamber 126, and includes a horizontal arm 122 extending in a horizontal direction perpendicular to a longitudinal direction of the vertically oriented boat 108. A rotational driving unit 118 is installed onto a lower portion of the horizontal arm 122 and the lid member 110 is installed onto an upper portion of the horizontal arm 122.

A mechanical seal 124 is interposed between the lid member 110 and the horizontal arm 122, to sufficiently prevent gas leakage through the gap between the rotational axis 116 and the lid member 110. The turntable 114 is connected to the rotational driving unit 118 through the lid member 110, the mechanical seal 124 and the horizontal arm 122.

The manifold 106 is positioned at an upper portion of the load-lock chamber 126. The boat 108 vertically moves between the processing chamber 102 and the load-lock chamber 126.

The vertical driving unit 120 includes the horizontal arm 122, a power driver 128 for generating a driving force that moves the horizontal arm 122 in a vertical direction and a driving axis 130 for transferring the driving force. For example, the power driver 128 may include a first motor (not shown), and the driving axis 130 may include a lead screw that rotates in accordance with rotating power generated from the first motor. The horizontal arm 122 is connected to the driving axis 130 and vertically moves by rotation of the driving axis 130.

The rotational driving unit 118 may also include a second motor (not shown). A rotational force generated from the second motor may be applied to the rotational axis 116 through a driving gear coupled to the second motor, a driven gear coupled to the rotational axis 116 and a timing belt connected between the driving gear and the driven gear. Alternatively, the driving gear and the driven gear may make direct contact with each other without an intermediate element, such as the timing belt, as would be known to one of ordinary skill in the art. A gas provider 132, shown in more detail in FIG. 4, is positioned at a side portion of the load-lock chamber 126.

Referring to FIG. 4, the gas provider 132 provides source gases to be deposited onto each of the wafers in the boat 108 of the processing chamber 102, as well as purge gases for purging the inside of the processing chamber 102.

In the various embodiments, source materials, such as metals, for forming the thin layer are to be distributed onto each wafer. The source materials are not supplied into the processing chamber as the source materials themselves, but as a reactant which includes the source materials, such as metal organic precursors or metal halides. In such a case, the organic ligands or the halides that combine to the source materials are removed from the processing chamber 102 by a chemical exchange. Therefore, chemical byproducts of the chemical exchange may be minimized in the processing chamber 102.

In addition, the source gases for the thin layer may be independently provided into the processing chamber 102 in accordance with each step of the deposition process. Accordingly, each kind of source gas corresponding to each step of the deposition process is injected into the processing chamber in a pulse-like manner, and the source gases are not mixed with each other in the processing chamber. For example, when the thin layer is formed in the processing chamber using first and second source gases, the first source gas is input into the processing chamber first, so that the first source gas is chemisorbed onto the substrate. Thereafter, the second source gas is input into the processing chamber, and is chemically reacted with the first source gas, which has been already chemisorbed onto the substrate.

In an embodiment, the gas provider 132 includes a first provider 134 for supplying a first source gas to be applied onto the wafer, a second provider 136 for supplying a second source gas to be applied onto the wafer and a third provider 138 for supplying a purge gas(es) into the processing chamber 102. The first and second source gases may be determined in accordance with the kind of thin layer to be deposited on the wafer, as is known to one of ordinary skill in the art.

The first and second source gases may be transferred into the processing chamber 102 by first and second carrier gases, respectively. Examples of the purge gas and the first and second carrier gases include inert gases, such as argon (Ar) gas and nitrogen ($N_2$) gas.

The gas provider 132 is connected to nozzle pipes 140a, 140b and 140c in the manifold 106 through supply pipes. For example, the first provider 134 is connected to the first nozzle pipe 140a arranged in the manifold 106 through a first supply pipe 142a, and the second provider 136 is connected to the second nozzle pipe 140b arranged in the manifold 106 through a second supply pipe 142b. The third provider 138 is connected to the first and second supply pipes 142a and 142b through first and second connection pipes 144a and 144b, and is connected to the third nozzle pipe 140c arranged in the manifold 106 through a third supply pipe 142c. Accordingly, the purge gases are provided by the third provider 138 into the processing chamber 102 through the first connection pipe 144a, the first supply pipe 142a, the first nozzle pipe 140a, the second connection pipe 144b, the second supply pipe 142b, the second nozzle pipe 140b, the third supply pipe 142c and the third nozzle pipe 140c.

In the depicted example embodiment, the first provider 134 may include a first reservoir 146a for containing a first carrier gas, a first valve 148a for controlling the flow of the first carrier gas, a second reservoir 146b for containing a liquid metal precursor, a mass flow controller 150 for controlling the mass flow rate of the liquid metal precursor and a vaporizer 152 for vaporizing the liquid metal precursor. For example, the vaporizer 152 may include a bubbler for vaporizing the liquid metal precursor, and the metal precursor may include materials of high dielectric constant, such as hafnium butoxide ($Hf(OC_4H_9)_4$), tetrakis(ethylmethylamino)hafnium (TEMAH) ($Hf(NCH_3C_2H_5)_4$), and tetrakis(ethylmethylamino)zirconium (TEMAZ) ($Zr(NCH_3C_2H_5)_4$).

The first reservoir 146a and the vaporizer 152 are connected to each other through a third connection pipe 144c, and the first valve 148a is installed in the third connection pipe 144c. The second reservoir 146b and the vaporizer 152 are connected to each other through a fourth connection pipe 144d, and the mass flow controller 150 is installed in the fourth connection pipe 144d.

The liquid metal precursor in the second reservoir 146b is vaporized in the vaporizer 152 to form a vaporized metal precursor (hereinafter referred to as a metal precursor gas). A mixture of the metal precursor gas and the first carrier gas is transferred to a buffer 139, having a constant volume, through the first supply pipe 142a, and the mixture is pressurized to a sufficient pressure, e.g., exceeding atmospheric pressure. Then, the mixture of the metal precursor gas and the first carrier gas is supplied onto each of the wafers through multiple first nozzles extending in a longitudinal direction of the first nozzle pipe 140a. Since the metal precursor gas has a sufficient pressure due to the buffer 139, the metal precursor gas may be injected into the processing chamber 102 through the first nozzles 156a at a substantially uniform pressure.

The second provider 136 includes a third reservoir 146c for containing a second carrier gas and a fourth reservoir 146d for containing a second source gas, and is connected to the second nozzle pipe 140b through the second supply pipe 142b.

In the depicted example embodiment, the second supply pipe 142b is connected to the third and fourth reservoirs 146c and 146d through fifth and sixth connection pipes 144e and 144f, respectively. The second supply pipe 142b and the fifth and sixth connection pipes 144e and 144f are interconnected with one another at a first junction member 154a. A second valve 148b for controlling the flow of the second carrier gas is installed in the fifth connection pipe 144e, and a third valve 148c for controlling the flow of the second source gas is installed in the sixth connection pipe 144f.

In the depicted example embodiment, the third provider 138 includes a fifth reservoir (not shown) for containing the purge gas(es). The first connection pipe 144a is connected to the third provider 138 and jointed to the first supply pipe 142a at a second junction member 154b. The second connection pipe 144b is connected to the third provider 138 and jointed to the second supply pipe 142b at a third junction member 154c. A fourth valve 148d is installed in the first connection pipe 144a to control the mass flow rate of the purge gas passing through the first nozzle pipe 140a, and a fifth valve 148e is installed in the second connection pipe 144b to control the mass flow rate of the purge gas passing through the second nozzle pipe 140b. In addition, the third gas provider 138 is connected to the third nozzle pipe 140c through the third supply pipe 142c to rapidly purge the processing chamber 102. A sixth valve 148f is installed in the third supply pipe 142c to control the mass flow rate of the purge gas passing through the third nozzle pipe 140c.

The first, second and third supply pipes 142a, 142b and 142c are jointed to the first, second and third nozzle pipes 140a, 140b and 140c at fourth, fifth and sixth junction members 154d, 154e and 154f in the manifold 106, respectively.

In the depicted example embodiment, a seventh valve 148g may be further installed in the first supply pipe 142a between the vaporizer 152 and the second junction member 154b, to control the mass flow rate of the first source gas. Also, an eighth valve 148h may be further installed in the second supply pipe 142b between the first and third junction members 154a and 154c to control the mass flow rate of the second source gas. While the exemplary embodiment described above provides that the first and second carrier gases and the purge gases are independently supplied into the processing chamber 102 from individual reservoirs, the first and second carrier gases and the purge gases may also be supplied together with one another from one reservoir, as would be known to one of ordinary skill in the art.

A fourth supply pipe 142d may be diverged from the first supply pipe 142a between the vaporizer 152 and the buffer 139. The fourth supply pipe 142d is connected to a pump unit 162 for creating a vacuum inside the processing chamber 102. The vaporizer 152 maintains an idling operation for maintenance of the vaporizer 152, even when a deposition process is not performed in the processing chamber 102. In the idling operation of the vaporizer 152, a dummy gas is supplied into the vaporizer 152 and exhausted through the fourth supply pipe 142d. For example, nitrogen ($N_2$) gas may be supplied into the vaporizer 152 as the dummy gas. A ninth valve 148i may be installed in the fourth supply pipe 142d.

In the depicted embodiment, the seventh valve 148g is closed and the ninth valve 148i is opened in the idling operation of the vaporizer 152, so that the dummy gas is exhausted outwardly through the fourth supply pipe 142d. In particular, the fourth supply pipe 142d may be pressurized by the pump unit 162 to accelerate the exhaustion of the dummy gas through the fourth supply pipe 142d.

In contrast, when a deposition process begins in the processing chamber 102, the ninth valve 148i is closed and the gases passing through the vaporizer 152 are accumulated in the buffer 139. When the inner pressure of the buffer 139 reaches a target pressure that may be set in advance, for example, a pressure greater than atmospheric pressure, the seventh valve 148g is opened and the first source gas is supplied to the first nozzle pipe 140a. The injection uniformity of the first source gas may be improved by a pressure increase of the first source gas. Therefore, increasing the target pressure, which is applied to the first source gas passing through the first nozzle pipe 140a, may sufficiently improve the injection uniformity of the first source gas into the processing chamber 102. For example, the first source gas may be injected into the processing chamber 102 at a pressure of about 0.5 MPa to about 1 MPa.

The first nozzle pipe 140a is positioned adjacent to wafers stacked in the boat 108, and may extend substantially perpendicular to the first supply pipe 142a. Multiple first nozzles 156a are installed in the first nozzle pipe 140a and the first source gas is injected into the processing chamber 102 through the first nozzles 156a. The first nozzles 156a are arranged along the first nozzle pipe 140a spaced apart from one another by a distance. In an embodiment, each of the first nozzles 156a penetrates a sidewall of the first nozzle pipe 140a, so that the first source gas is supplied onto the surface of each wafer stacked in the boat 108. In other words, each of the first nozzles 156a injects the first source gas into a space between the wafers, and the first source gas is supplied toward the center of the wafer through the first nozzles 156a. Since the first source gas is supplied to the first nozzle pipe 140a at a sufficiently high pressure by the buffer 108, each of the first nozzles 156a may supply the first source gas in substantially the same amount, improving the injection uniformity of the first source gas. It is understood that, although FIG. 4 depicts three first nozzles 156a for purposes of illustration, various embodiments may include any number of first nozzles 156a without departing from the spirit and scope of the present invention.

The second nozzle pipe 140b is also positioned adjacent to wafers stacked in the boat 108, and extends substantially parallel to the first nozzle pipe 140a. Multiple second nozzles 156b are installed in the second nozzle pipe 140b, and the second source gas is injected into the processing chamber 102 through the second nozzles 156b. The second nozzles 156b are arranged along the second nozzle pipe 140b spaced apart from one another by a distance. In an embodiment, each of the second nozzles 156b penetrates a sidewall of the second nozzle pipe 140b, so that the second source gas is supplied onto the surface of each wafer stacked in the boat 108. In other words, each of the second nozzles 156b injects the second source gas into a space between the wafers, and the second source gas is supplied toward the center of the wafer through the second nozzles 156b. It is understood that, although FIG. 4 depicts three second nozzles 156b for purposes of illustration, various embodiments may likewise include any number of second nozzles 156b without departing from the spirit and scope of the present invention.

The third nozzle pipe 140c is positioned between the first and second nozzle pipes 140a and 140b, and extends substantially parallel to the first and second nozzle pipes 140a and 140b. A third nozzle 156c is installed in the third nozzle pipe 140c, and the purge gases are injected into the processing chamber 102 through the third nozzle 156c. In an embodiment, the third nozzle 156c is installed in a top portion of the third nozzle pipe 140c, so that the purge gases are upwardly injected through the third nozzle 156c. In alternative embodiments, the third nozzle pipe 140c may include multiple third nozzles 156c, arranged along the third nozzle pipe 140b spaced apart from one another by a distance, such that each of the third nozzles 156c penetrates a sidewall of the second nozzle pipe 140c.

Referring to FIG. 3, the pump unit 162 for creating a vacuum inside the processing chamber 102 is connected to the manifold 106 through a vacuum pipe 160 and an isolation valve (not shown). The furnace 104 is positioned adjacent to a sidewall and a top portion of the processing chamber 102. In an embodiment, the processing chamber 102 may be maintained, for example, at a pressure of about 0.3 torr to about 1 torr and at a temperature of about 350° C. to about 550° C. in the deposition process.

A control unit 164 of the apparatus 900 controls the formation of the thin layer. The control unit 164 controls, for example, the gas provider 132, the vertical driving unit 120 and the rotational driving unit 118. In an embodiment, the control unit 164 controls the vertical driving unit 120 to move the boat 108 in which the wafers are stacked into the processing chamber 102, and controls the gas provider 132 to regulate the mass flow rate and feeding time of the source gases. More particularly, the control unit 164 controls the seventh valve 148g in accordance with the inner pressure of the buffer 139, so that the first source gas is uniformly provided into the processing chamber 102, to improve the injection uniformity of the first source gas.

In the example embodiment described above, the pressure of the source gases may be sufficiently increased so that the source gases may be injected into the processing chamber in a substantially uniform amount to improve the uniformity of the thickness of the thin layer on the substrate. More particularly, a thin layer of a high dielectric constant, such as a $Y_2O_3$ layer, a $HfO_2$ layer, a $ZrO_2$ layer, an $Nb_2O_5$ layer, a $BaTiO_3$ layer, and a $SrTiO_3$ layer, for example, may be formed to a uniform thickness, although the associated source materials may include metal precursors having high molecular weights.

While the example embodiment discloses a modification of an atomic layer deposition (ALD) apparatus for improving the thickness uniformity of a thin layer having a high dielectric constant, the same modification may be applied to an apparatus for a chemical vapor deposition (CVD) process, without departing from the spirit and scope of the present invention, on the condition that a vaporizer and source gases of high molecular weights are used for the CVD process, as would be known to one of ordinary skill in the art.

Method of Forming a Thin Layer

Figure 5:
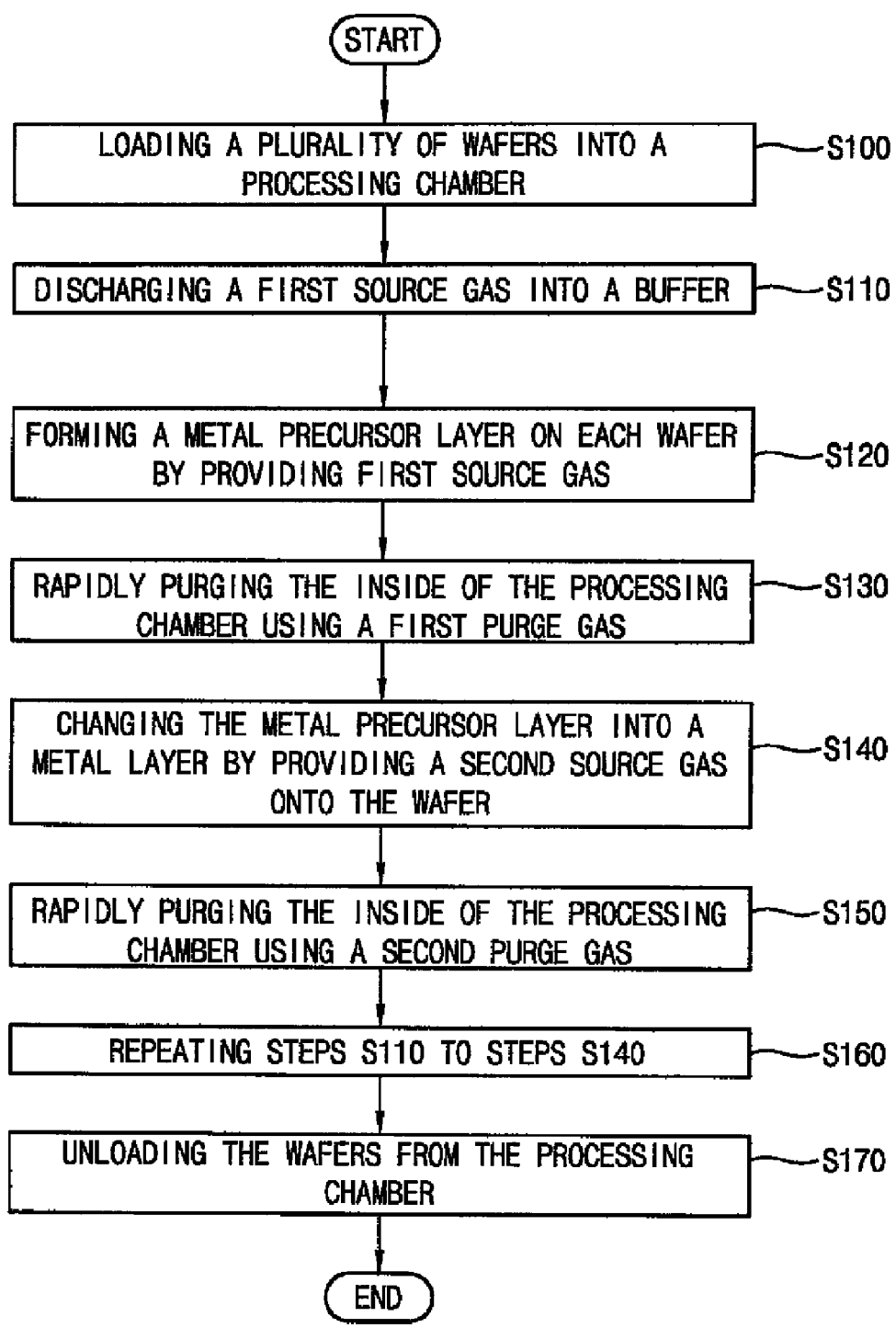
FIG. 5 is a flowchart illustrating a method of forming a thin layer in the apparatus shown in FIG. 3, according to an exemplary embodiment of the present invention.

FIG. 5 is a flowchart illustrating a method of forming a thin layer in the apparatus shown in FIG. 3. In the example embodiment, a thin layer for a semiconductor device may be formed on substrates through the following processing steps described with reference to FIGS. 3 to 5.

Referring to FIGS. 3 to 5, multiple semiconductor substrates, such as wafers, are loaded into the processing chamber 102 (step S100). In an embodiment, the wafers are stacked in the boat 108 in a vertical direction and spaced apart from one another by a predetermined distance. Each of the wafers may be positioned horizontally in the boat 108. Then, the boat 108 including the wafers is driven to move into the processing chamber 102 through the manifold 106 by a vertical driving unit 120.

Various semiconductor structures may be formed on each of the wafers. For example, the semiconductor structures may include a transistor, a lower electrode of a capacitor and a dielectric layer. The transistor may include a gate structure and impurity regions on which source and drain structures may be formed, and the lower electrode of the capacitor may be electrically connected to one of the impurity regions. The dielectric layer may be formed on the lower electrode of the capacitor. For example, the lower electrode of the capacitor may include doped polysilicon, and the dielectric layer may include a metal, oxide such as hafnium oxide ($HfO_2$) and zirconium oxide ($ZrO_2$).

Then, the first source gas may be discharged into the buffer 139 to increase the pressure of the first source gas (step S110). In an embodiment, the ninth valve 148i installed in the fourth supply pipe 142d is closed, terminating the idling operation of the vaporizer 152. The liquid metal precursor is provided into the vaporizer 152 from the second reservoir 146b. When performing the idling operation of the vaporizer 152, the deposition process is not performed in the processing chamber 102, so the seventh valve 148g on the first supply pipe 142a is closed and the first source gas is not provided to the first nozzle pipe 140a. The metal precursor gas, which is vaporized in the vaporizer 152, is only discharged into the buffer 139 through the first supply pipe 142a because the seventh and ninth valves 148g and 148i are closed, increasing the inner pressure of the buffer 139.

In an embodiment, the inner pressure of the buffer 139 may be varied in accordance with the mass flow rate of the liquid metal precursor that is controlled by the mass flow controller 150. For example, the mass flow controller 150 may supply the liquid metal precursor into the vaporizer 152 to such a degree that the inner pressure of the buffer 139 increases to a target pressure higher than atmospheric pressure, for example, about 0.5 MPa. Therefore, the target pressure of the buffer 139 may be set to be about 0.5 MPa by the mass flow controller 150.

When the inner pressure of the buffer 139 reaches the target pressure, the first source gas may be injected onto each of the wafers through the first nozzles to form a metal precursor layer on the wafer (step S120). In an embodiment, when detecting the target pressure from the buffer 139, the control unit 164 controls the seventh valve 148g to be opened, and the first source gas may be supplied into the first nozzle pipe 140a at the target pressure. As a result, the inside of the first nozzle pipe 140a is kept at a sufficiently high pressure, such that the first source gas may be injected in substantially the same amount through each of the first nozzles 156a, improving the injection uniformity of the first source gas. In an embodiment, the first source gas may be TEMAZ ($Zr(NCH_3C_2H_5)_4$), for example, which is supplied into the processing chamber 102. The mass flow controller 150 controls the mass flow of the TEMAZ ($Zr(NCH_3C_2H_5)_4$) to be about 200 mgm, for example. In such a case, the first valve 148a may control the mass flow rate of the first carrier gas to be about 0.5 standard liters per minute (slm), and the first source gas may be provided into the processing chamber 102 for about 3 minutes, for example.

The first purge gas may be provided into the processing chamber 102 through the first, second and third nozzles 156a, 156b and 156c, so that residue of the first source gas and the metal precursor physisorbed on the metal precursor layer are rapidly removed from the processing chamber 102 (step S130). In an embodiment, argon (Ar) gas may be provided into the processing chamber 102 for about 30 seconds. For example, the first and second nozzles 156a and 156b may provide the argon (Ar) gas at a rate of about 0.5 slm, respectively, and the third nozzle 156c may provide the argon (Ar) gas at a rate of about 2.0 slm, to perform a rapid purge process in the processing chamber 102.

The second source gas may be provided into the processing chamber 102 through the second nozzles 156b, so that the metal precursor layers on each of the wafers are formed into metal thin layers (step S140). In an embodiment, the second carrier gas may be controlled to an amount of about 0.5 slm by the second valve 148b, for example, and about 0.5 slm of ozone ($O_3$) gas may be provided into the processing chamber 102 as the second source gas for about 1 minute 30 seconds. As a result, a zirconium oxide layer is formed on each of the wafers to a uniform thickness.

Thereafter, the second purge gas may be provided into the processing chamber 102 through the first, second and third nozzles 156a, 156b and 156c (step S150), and residue of the second source gas and the byproducts are removed from the processing chamber 102. In an embodiment, nitrogen ($N_2$) gas may be provided into the processing chamber as the purge gas. For example, the first and second nozzles 156a and 156b may provide the nitrogen ($N_2$) gas at a rate of about 0.5 slm, respectively, and the third nozzle 156c may provide the nitrogen ($N_2$) gas at a rate of about 2.0 slm, to perform a rapid purge process to the processing chamber 102.

In the above unit cycle of the ALD process, the control unit 164 controls the operation of the mass flow controller 150 and each of the valves 148a, 148b, 148c, 148d, 148e and 148f for controlling the mass flow rates of the source gases and purge gases. In addition, the processing chamber 102 is maintained, for example, at a pressure of about 0.3 torr to about 1 torr and at a temperature of about 450° C. by the control unit 164.

The unit cycle of the ALD process may be repeated to form the zirconium oxide layer, for example, on each of the wafers to a desired thickness (step S160). When the zirconium oxide layer is formed on the wafer to the desired thickness, the wafers are unloaded from the processing chamber 102 (step S170). In an embodiment, the boat 108 including the wafers is unloaded from the processing chamber 102 to the load-lock chamber 126 by the vertical driving unit 120.

Estimation of Thickness Uniformity of a Thin Layer

Figure 6:
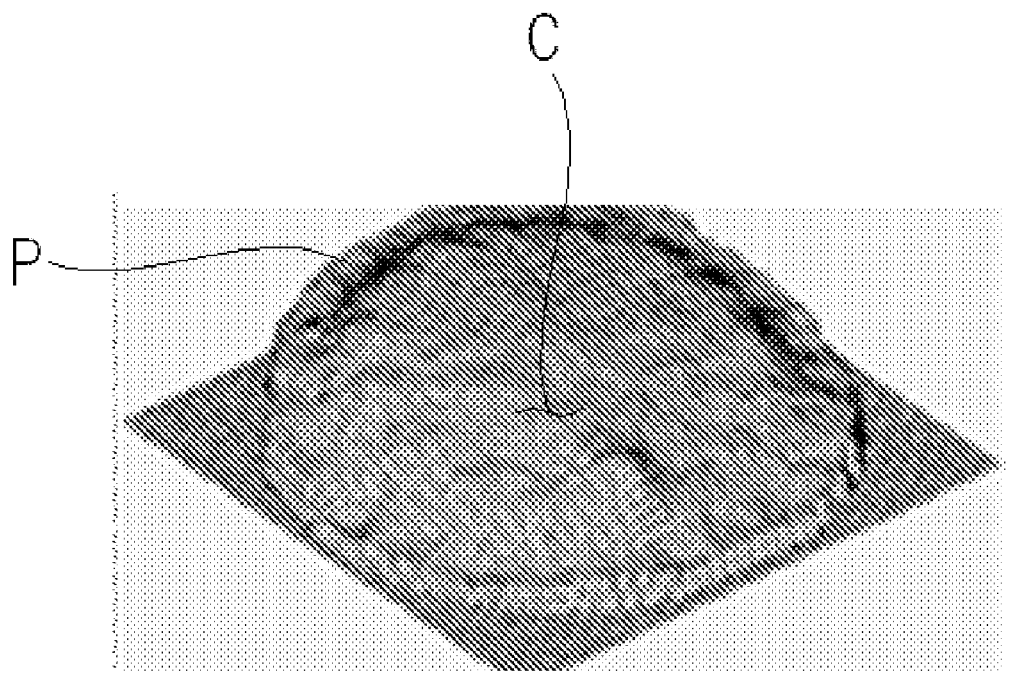
FIG. 6 is a scanning electron microscope (SEM) picture showing a hafnium oxide (HfO$_2$) layer formed in an apparatus, according to an exemplary embodiment of the present invention.

FIG. 6 is a scanning electron microscope (SEM) picture showing a hafnium oxide ($HfO_2$) layer formed in an apparatus for forming a thin layer in accordance with the exemplary embodiment of the present invention discussed above. FIG. 7 is a view illustrating a thickness distribution of a thin layer formed in an apparatus for forming a thin layer in accordance with the exemplary embodiment. The hafnium oxide layer in FIG. 6 was formed on a 200 mm wafer, and may be compared to FIG. 1, which is a SEM picture showing a hafnium oxide layer formed by an ALD process in a conventional batch-type ALD apparatus. The thickness distribution in FIG. 7 was measured with respect to a thin layer that was formed on a 300 mm wafer in an apparatus for forming a thin layer in accordance with the exemplary embodiment, and may be compared to FIG. 2, which illustrates a thickness distribution of a thin layer formed by a conventional batch-type ALD apparatus. For the comparison of FIGS. 6 and 7 with FIGS. 1 and 2, respectively, a thin layer on a top wafer, which was positioned at the top portion of the boat in the processing chamber, was analyzed and measured by an analysis and measurement apparatus.

Referring again to FIG. 6, a thickness difference between central and peripheral portions of the thin layer is significantly improved, as compared to the results shown in FIG. 1. The hafnium oxide layer in FIG. 6 is estimated to have an average thickness of about 24.04 Å with a thickness deviation of about 0.27. In contrast, the hafnium oxide layer in FIG. 1 has a thickness deviation of about 2.12. The comparison between FIG. 6 and FIG. 1 shows that the apparatus for forming a thin layer according to the exemplary embodiment of the present invention may sufficiently improve the thickness uniformity of a thin layer on the same wafer. In addition, an average thickness deviation of the thin layers on all of the wafers in the boat was estimated to be about 1.01. In other words, the results in FIG. 6 show that the thickness uniformity is improved by more than about 33% as compared to the conventional average thickness deviation of about 3.09. Accordingly, these results show that the apparatus for forming a thin layer according to the present invention may sufficiently improve thickness uniformity of an individual thin layer on each wafer in the boat, thereby improving average thickness uniformity of thin layers on all of the wafers in the boat.

FIG. 7 shows that a maximum thickness of the thin layer formed according to an embodiment of the present invention was about 40.65 Å, and a minimum thickness of the thin layer was about 38.70 Å. Thus, the thickness difference was estimated to be just about 1.95, which indicates that the thickness difference between central and peripheral portions of a wafer is insignificant. The comparison between FIG. 7 and FIG. 2 indicates that the apparatus for forming a thin layer according to the present invention may significantly decrease the thickness variation between central and peripheral portions of a wafer, thereby sufficiently improving the thickness uniformity.

Figure 8:
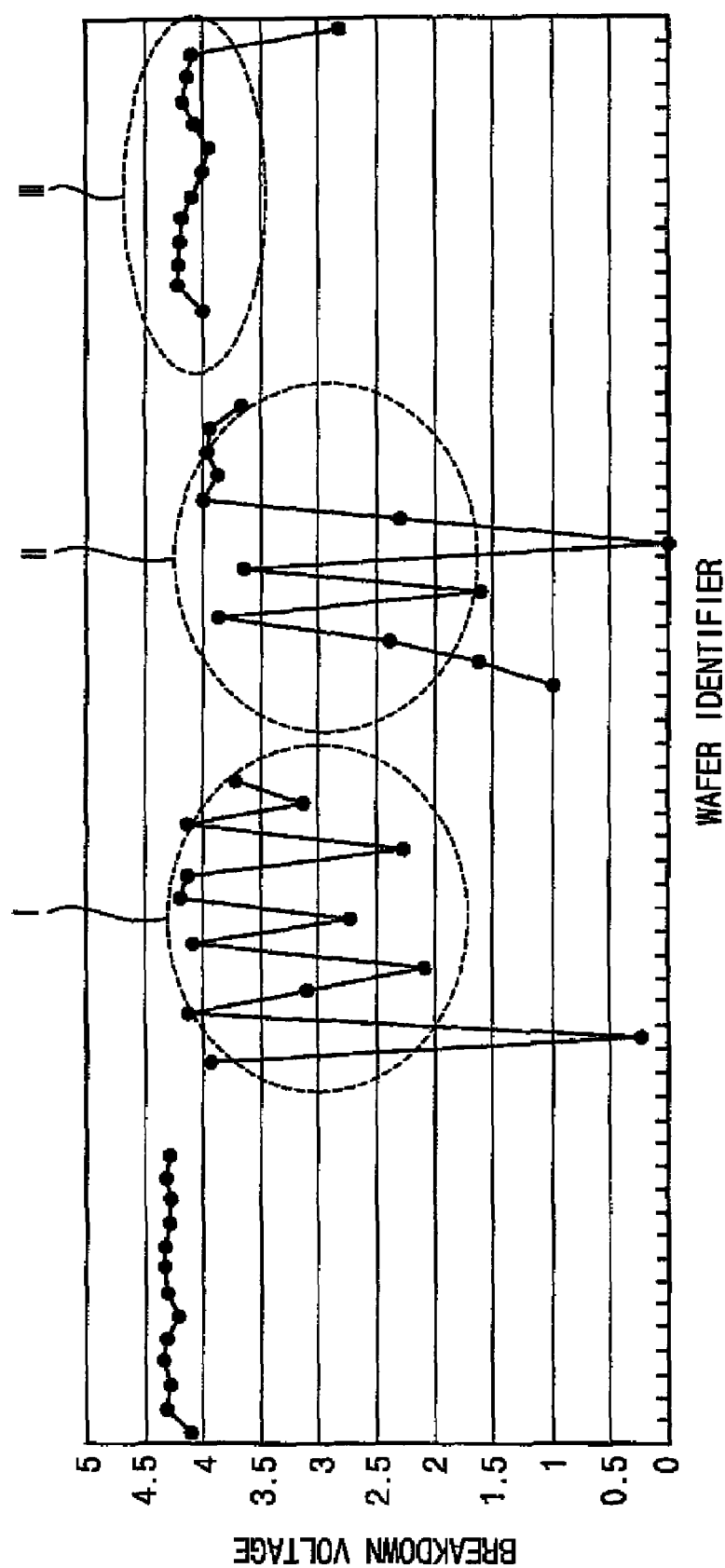
FIG. 8 is a graph showing breakdown voltages of various thin layers formed in a conventional apparatus and an apparatus according to an exemplary embodiment of the present invention.

FIG. 8 is a graph showing breakdown voltages of various thin layers formed in a conventional batch-type ALD apparatus and an apparatus for forming a thin layer according to embodiments of the present invention. In FIG. 8, Graph I shows breakdown voltages of thin layers, which were formed on 20 wafers, respectively, in the conventional batch-type ALD apparatus. Graph II shows breakdown voltages of thin layers, which were formed on 20 wafers after a preliminary process using ozone ($O_3$) gas, respectively, in the conventional batch-type ALD apparatus. Graph III shows breakdown voltages of thin layers, which were formed on 20 wafers, respectively, in the apparatus for forming a thin layer according to the present invention.

Referring to FIG. 8, the conventional thin layers formed in the conventional batch-type ALD apparatus were measured to have non-uniform breakdown voltages irrespective of the preliminary process using ozone ($O_3$) gas. In contrast, the thin layers formed according to the present invention were measured to have almost uniform breakdown voltages among the wafers on which the thin layers were formed.

A breakdown voltage of a thin layer is the voltage applied to a semiconductor device when the semiconductor device is broken down due to a leakage current, and is proportional to a thickness of the thin layer. Therefore, the irregularity of the breakdown voltage in Graph I and Graph II indicates that thin layers of the semiconductor substrates have non-uniform thicknesses, and the that non-uniformity of the thicknesses has no relation with the ozone ($O_3$) preliminary process. However, Graph III shows a substantially constant breakdown voltage among the semiconductor substrates, indicating that the thin layers formed according to the present invention have substantially uniform thicknesses. As a result, the apparatus for forming a thin layer of the present invention is shown to sufficiently improve the thickness uniformity of the thin layer.

According to exemplary embodiments of the present invention, vaporized source gases are discharged into a buffer and the pressure of the source gases is increased in the buffer, so that the source gases may be injected into a processing chamber at a high pressure to improve the injection uniformity of the source gases and the thickness uniformity of a thin layer in the processing chamber. Recent technological trends, such as higher integration of semiconductor devices, require a thin layer having a high dielectric constant.

However, a conventional batch-type deposition apparatus necessarily causes large differences in thickness of thin layers between a top wafer and a bottom wafer in the boat, as well as within each thin layer, because the source gases of a high dielectric constant are not sufficiently vaporized, for example, due to high molecular weights. In the embodiments of the present invention, the source gases are provided into the processing chamber at a high pressure, so that the source gases may be injected onto each of the wafers in substantially the same amount, to improve thickness uniformity of thin layers on wafers in a batch-type deposition apparatus.

While the present invention has been shown and described with reference to exemplary embodiments thereof, it will be apparent to those skilled in the art that various changes and modifications may be made without departing from the spirit and scope of the present invention. Therefore, it should be understood that the above embodiments are not limiting, but illustrative.

What is claimed is:

1. A method of forming a thin layer on each of a plurality of semiconductor substrates, the method comprising:
   forming a first source gas, comprising a metal precursor gas, having a pressure higher than atmospheric pressure, forming the first source gas comprising discharging the metal precursor gas into a buffer having a constant volume;
   forming a metal precursor layer on each semiconductor substrate of the plurality of semiconductor substrates by providing the first source gas onto the plurality of semiconductor substrates in a processing chamber;
   purging an inside of the processing chamber using a first purge gas;
   changing the metal precursor layer into a metal layer by providing a second source gas onto the metal precursor layer; and
   purging the inside of the processing chamber using a second purge gas.

2. The method of claim 1, wherein forming the first source gas further comprises:
   disconnecting the buffer and the processing chamber;
   vaporizing a liquid metal precursor in a vaporizer to form the metal precursor gas; and
   stopping an exhaustion of a dummy gas for performing an idling operation of the vaporizer.

3. The method of claim 2, wherein disconnecting the buffer and the processing chamber comprises:
   controlling a first valve in a first supply pipe between the buffer and the processing chamber.

4. The method of claim 2, further comprising:
   controlling the pressure of the first source gas by controlling a mass flow rate of the liquid metal precursor that flows into the vaporizer.

5. The method of claim 4, wherein the pressure of the first source gas is controlled to be about 0.5 MPa to about 1.0 MPa.

6. The method of claim 2, wherein stopping the exhaustion of the dummy gas comprises:
   controlling a second valve in a second supply pipe between the vaporizer and a pump unit for creating a vacuum on the inside of the processing chamber,
   wherein the second valve is closed while discharging the metal precursor gas into the buffer to increase the pressure of the first source gas.

7. The method of claim 2, wherein the dummy gas comprises nitrogen ($N_2$) gas.

8. The method of claim 2, wherein the liquid metal precursor comprises at least one of hafnium butoxide ($Hf(OC_4H_9)_4$), tetrakis(ethylmethylamino)hafnium (TEMAH) ($Hf(NCH_3C_2H_5)_4$), and tetrakis(ethylmethylamino)zirconium (TEMAZ) ($Zr(NCH_3C_2H_5)_4$).

9. The method of claim 1, wherein the plurality of semiconductor substrates are arranged vertically in the processing chamber and are spaced apart from one another by a predetermined distance, and each substrate is positioned substantially horizontally with respect to the processing chamber.

10. The method of claim 9, wherein the first source gas and the second source gas are provided through first nozzles and second nozzles, respectively, positioned in a vertical direction of the processing chamber adjacent to the plurality of semiconductor substrates.

11. The method of claim 10, wherein the first purge gas and the second purge gas are provided through the first nozzles, the second nozzles and at least one third nozzle interposed between the first and second nozzles.

12. The method of claim 1, wherein the processing chamber has a temperature of about 350° C. to about 550° C.

13. The method of claim 1, wherein the second source gas comprises ozone ($O_3$) gas.

14. The method of claim 1, wherein each of the first purge gas and the second purge gases comprises nitrogen ($N_2$) gas or an inert gas.

15. The method of claim 1, wherein the first source gas is provided by a first carrier gas and the second source gas is provided by a second carrier gas.

16. The method of claim 15, wherein a mass flow rate of the first purge gas is substantially identical to a mass flow rate of the second purge gas, and a mass flow rate of the first carrier gas is substantially identical to a mass flow rate of the second carrier gas.

* * * * *